(12) United States Patent
Inoue

(10) Patent No.: US 8,841,734 B2
(45) Date of Patent: Sep. 23, 2014

(54) SENSOR ELEMENT

(75) Inventor: Hiromoto Inoue, Chiyoda-ku (JP)

(73) Assignee: Mitsubishi Electric Corporation, Tokyo (JP)

(*) Notice: Subject to any disclaimer, the term of this patent is extended or adjusted under 35 U.S.C. 154(b) by 134 days.

(21) Appl. No.: 13/204,058

(22) Filed: Aug. 5, 2011

(65) Prior Publication Data

US 2012/0286379 A1    Nov. 15, 2012

(30) Foreign Application Priority Data

May 9, 2011  (JP) ................................ 2011-104247

(51) Int. Cl.
    *H01L 29/82*    (2006.01)
(52) U.S. Cl.
    USPC ........... 257/415; 257/414; 257/416; 257/417; 257/418; 257/419; 257/E29.324
(58) Field of Classification Search
    USPC ............ 257/414–419, E29.324; 73/715–722; 438/53
    See application file for complete search history.

(56) References Cited

U.S. PATENT DOCUMENTS

| | | | | |
|---|---|---|---|---|
| 5,637,905 A | * | 6/1997 | Carr et al. | 257/418 |
| 6,240,785 B1 | * | 6/2001 | Chapman et al. | 73/727 |
| 6,278,378 B1 | * | 8/2001 | Feiner et al. | 340/815.45 |
| 6,935,181 B2 | * | 8/2005 | Miyashita et al. | 73/718 |

FOREIGN PATENT DOCUMENTS

| | | |
|---|---|---|
| JP | 4-316378 A | 11/1992 |
| JP | 6-37735 U | 5/1994 |
| JP | 8-94471 A | 4/1996 |
| JP | 2002-55008 A | 2/2002 |
| JP | 2002-286567 A | 10/2002 |
| JP | 2008-088017 A | 4/2008 |
| JP | 2008-190970 A | 8/2008 |

OTHER PUBLICATIONS

Japanese Office Action, dated Apr. 16, 2013, issued in corresponding Japanese Patent Application No. 2011-104247.

* cited by examiner

*Primary Examiner* — Samuel Gebremariam
(74) *Attorney, Agent, or Firm* — Sughrue Mion, PLLC

(57) ABSTRACT

A sensor element includes: a first substrate in which a diaphragm is configured on a main surface; a second substrate which is provided on the side opposite to the diaphragm of the first substrate; a cavity which is provided just below the diaphragm of the first substrate; a bonding position which is provided at a bonding position between the first substrate and the second substrate for airtight sealing of the cavity; and a bump portion which is provided at the fitting portion, and protects a fitted state between the first substrate and the second substrate.

12 Claims, 8 Drawing Sheets

SENSOR ELEMENT

BACKGROUND OF THE INVENTION

1. Field of the Invention

The present invention relates to sensor elements obtained by using, for example, technologies for semiconductors and micro electro mechanical systems (hereinafter, referred to as MEMS).

2. Description of the Related Art

In recent years, sensor devices introduce microfabrication and techniques which apply technologies for semiconductors and MEMS and tend to have more sensitive and complicated structures. Among the sensor devices, examples of sensor elements each having a thin film hollow structure include, for example, a pressure sensor, an ultrasonic sensor, and a flow sensor.

Such sensor elements are formed from a wafer and are each provided with a cavity that is formed just below a wafer main surface on which wiring, circuit, and the like are provided. The cavity is formed by, for example, deep dug etching using inductively coupled plasma-reactive ion etching (hereinafter, referred to as ICP-RIE) from the back surface of the element or wet etching by chemical solution of potassium hydroxide (referred to as KOH) and tetra methyl ammonium hydroxide (referred to as TMAH). For example, in the case of the pressure sensor, a diaphragm in which a detection unit is supported on the cavity by thin film stress control is provided.

Furthermore, the pressure sensor includes a capacitance type, which converts a change in electrostatic capacitance to an electrical signal and detects, a piezoresistance type, and the like. The piezoresistance type is formed with a Wheatstone bridge circuit including a plurality of piezoresistances in the diaphragm. The piezoresistance type pressure sensor uses a function, which converts a change in resistance of the piezoresistance to an electrical signal and detects, for the sensor, the resistance change of the piezoresistance being caused by external pressure. Incidentally, the piezoresistance type pressure sensor includes a differential pressure sensor and an absolute pressure sensor that measures absolute pressure by airtight sealing the cavity by a base.

Next, the structure of a conventional absolute pressure sensor element 100 will be described with reference to FIGS. 7A to 7C. First, FIG. 7A is a structural plan view in which the conventional sensor element 100 is seen from the top side.

The sensor element 100 includes piezoresistances 4, terminal pads 7, wiring 5 connected thereto, an insulating film 6, and the like. Furthermore, a dotted line in the drawing shows the position of a diaphragm 9. Furthermore, all four piezoresistances 4 provided in the drawing are formed in the diaphragm 9.

Further, a cavity 8a is formed just below the diaphragm 9 and the cavity 8a is airtight sealed under vacuum. Incidentally, reference numeral 16 denotes a scratch occurred on the back surface side of a silicon on insulator (hereinafter, referred to as SOI) wafer 10 and the scratch 16 reaches from the cavity 8a to the cut surface of the sensor element 100. 17 denotes an attached foreign material remained on the back surface of the SOI wafer 10. Incidentally, the structural plan view of the sensor element 100 shows a shape being cut and separated by dicer cutting or the like.

Next, FIG. 7B is a view of a hypothetical cross-sectional structure showing the structure of the sensor element 100 obtained by cutting an A-A' porion of a dashed-dotted line shown in the structural plan view of FIG. 7A. The sensor element 100 has a structure in which a base 11 of another glass wafer is bonded to the SOI wafer 10 and the cavity 8 is formed inside thereof. 13 denotes a fitting portion.

Next, a Wheatstone bridge circuit composed of the piezoresistances 4 and the wiring 5 provided on the diaphragm 9 is formed on the main surface of the SOI wafer 10. The Wheatstone bridge circuit is coated with the insulating film 6. Incidentally, a gap due to the scratch 16 simulates the scratch occurred on the fitting portion 13 on the back surface side of the SOI wafer 10.

Next, a view of a hypothetical cross-sectional structure of FIG. 7C will be described. The cross-sectional structural view shows a cross-sectional structure of the structure of the sensor element 100 obtained by cutting a B-B' portion of a dashed-dotted line shown in the structural plan view of FIG. 7A, as in FIG. 7B. 17 simulates the attached foreign material remained on the fitting portion 13. Furthermore, the drawing images a state where the attached foreign material 17 becomes a bump and accordingly the fitting portion 13 floats thereon.

Next, processes for obtaining the structure of the conventional sensor element 100 will be described in numerical order along a flow chart of FIGS. 8A to 8F. FIGS. 8A to 8F show a process flow chart of the hypothetical cross-sectional structure of the structure of the sensor element 100 obtained by cutting a C-C' portion of a dashed-dotted line shown in the structural plan view of FIG. 7A.

First, reference numeral 10 of this process flow chart denotes an SOI wafer, which is a special wafer that includes: an n-type active layer 1 in which plane orientation on the upper side of the main surface is (100), the n-type active layer 1 being made of silicon or the like; an embedded oxide film 2; and a supporting substrate 3 on the back surface side. The SOI wafer 10 is manufactured by, for example, UNIBOND that is smart cut technology or separation by implanted oxygen (referred to as SIMOX). In FIG. 8A, piezoresistances 4 and terminal pads 7 formed on the SOI wafer 10 by the impurity diffusion method or the ion implantation method are formed at the positions shown in the drawing.

Next, an insulating film 6 is coated on the main surface of the SOI wafer 10 (FIG. 8B). Incidentally, the insulating film 6 is coated on the whole of the main surface of the SOI wafer 10 by using a method of sputtering or chemical vapor deposition (hereinafter, referred to as CVD). In the process coated with the insulating film 6, the insulating film 6 is also coated on the terminal pads 7; and therefore, etching processing for opening the terminal pads 7 is needed. First, a resist mask is provided on a region other than an opening portion of the terminal pad 7; and then, unnecessary insulating film 6 provided on the terminal pad 7 is removed by dry etching using mixed gas of, for example, fluorine based gas and oxygen ($O_2$). This process is performed and accordingly a structural cross-sectional view of FIG. 8B is obtained.

Processing anchored by the processing of the back surface side of the SOI wafer 10 is performed in the subsequent processing of FIG. 8C. In FIG. 8C, processing for coating both surfaces of the SOI wafer 10 with masks is performed. First, a protecting mask 14 is formed on the main surface of the SOI wafer 10. The protecting mask 14 is intended to protect the main surface; and therefore, for example, coating with the resist may be performed on the whole surface.

Next, patterning of a back side mask 15 for forming a cavity 8a on the back surface of the SOI wafer 10 is performed by photosensitive agent such as the resist. First, resist coating is performed. Next, an exposure superimposed with the mask is performed by equipment such as a double sided aligner by utilizing an alignment mark on the main surface; finally, processing procedure is performed in developing solution and accordingly a pattern of an opening portion 12 is obtained.

Next, in FIG. 8D, deep dug etching using ICP-RIE is performed from the back surface side of the SOI wafer 10. This etching is performed; and accordingly, the cavity 8a is formed just below a diaphragm 9. Incidentally, as shown in the drawing, the back side mask 15 becomes thinner than the original film thickness because of being exposed to plasma by the ICP-RIE etching processing for a long time. Therefore, a material to be selected for the back side mask 15 is required for an etching selective ratio with silicon, and it is important to select the film thickness or material of the back side mask 15, the film thickness needing quantity as much as quantity not to be vanished away in the process being dug down from the supporting substrate 3 to the embedded oxide film 2.

Next, in FIG. 8E, the protecting mask 14 and the back side mask 15 coated on both surfaces of the SOI wafer 10 are removed by using a processing method such as a plasma ashing apparatus using oxygen gas and resist stripping solution. Process processing of the back surface of the SOI wafer 10 is completed through the above processing. Finally, bonding to a base 11 is performed in FIG. 8F; and accordingly, the structure of the conventional sensor element 100 is obtained.

Incidentally, reference numeral 13 in FIG. 8F denotes a fitting portion. As shown in the drawing, all the back surface of the SOI wafer 10 other than the cavity 8a is utilized as the fitting portion 13. In addition, a process of a piezoresistance type pressure sensor element using an SOI wafer 10 is introduced in Japanese Unexamined Patent Publication No. 2008-190970.

PRIOR ART DOCUMENT

Patent Document

[Patent Document 1] Japanese Unexamined Patent Publication No. 2008-190970
[Patent Document 2] Japanese Unexamined Patent Publication No. 2008-88017

Problems to be Solved by the Invention

In the aforementioned conventional sensor element, the protecting mask 14 is provided on the main surface of the SOI wafer 10 at the process of FIG. 8C in the process flow chart of the cross-sectional structure shown in FIGS. 8A to 8F. The back surface of the SOI wafer 10 is not protected at all at this step and therefore a contact with a transfer system equipped in equipment related to process processing is unavoidable. For example, a scratch 16 due to coming in contact with a vacuum chuck occurs and an attached foreign material 17 or the like remained on a conveyor belt, a transfer beam, or the like is transcribed to the back surface side of the SOI wafer 10 and is attached. When the case where process processing of a sensor element 100 is performed by diverting existing semiconductor equipment is held up as an example, a one-sided process is mainstream in the conventional semiconductor equipment; and therefore, a dent such as the scratch 16 on the back surface side of the wafer that comes in contact with a transfer robot or the like and a contamination due to the attached foreign material 17 are not properly concerned.

FIGS. 9A and B show an example of the occurrence of an attached foreign material 17 and a scratch 16 in a coater/developer (coating and developing apparatus). FIG. 9A is a view that images a structure in which an SOI wafer 10 is transferred to a coater cup 28 of the coater/developer and is rotated. Hereinafter, a resist coating process will be described as an example. First, a cassette carrier for acceptance and a cassette carrier for discharge are provided on the coater/developer respectively; and a conveyor belt such as a rubber belt and a transfer beam made of metal material are used for transfer. For example, the SOI wafer 10 discharged from the cassette carrier of discharge destination arrives on the coater cup 28 in the drawing and a vacuum chuck 29 moves upward; and accordingly, contact and adsorption are performed. The vacuum chuck 29 is formed with groove processing for suction on, for example, Teflon (trademark) and has a 3 inch Φ size (a circle size of 3 inches in diameter).

Next, the vacuum chuck 29 moves downward to the position shown in the drawing; and then, resist coating is performed via a nozzle 27. After excess resist is removed by high speed rotation, rotation stop of the wafer and release of adsorption are performed and the SOI wafer 10 begins to move by the conveyor belt to a different location where a hot plate is provided. FIG. 9B shows the back surface of the SOI wafer 10 in which the resist coating process has been completed. As shown in the drawing, the circular scratch 16 occurs at an impression of the vacuum chuck 29. This scratch occurs at the step when the SOI wafer 10 is adsorbed, and this scratch is formed when a hard substance such as a silicon fraction sticks to the vacuum chuck 29. Further, the SOI wafer 10 slightly moves toward a θ direction at the steps of the contact and the adsorption. This also causes that a continuous scratch 16 is formed on the SOI wafer 10. The silicon fraction or the like is introduced from the SOI wafer 10 or the like.

Next, the attached foreign materials 17 of FIG. 9B are those that image attached foreign materials 17 in which resist mists 31, which are generated during high speed rotation of the SOI wafer 10 and flown to the hot plate side, are attached to the conveyor belt and then transcribed to the back surface side of the SOI wafer 10. Such an attached foreign material 17 also contaminates the transfer beam that is used for a movement to the hot plate. Furthermore, if the attached foreign material 17 is an organic based material, there is concern that gas is discharged from the attached foreign material 17 in the heating process of approximately 400° C. performed during anodic bonding. The discharge of gas brings about the possibility of a bonding defect of the fitting portion 13. Further, as another example of the attached foreign material 17 other than the coater/developer, an inorganic attached foreign material 17 such as a metal scrap and a silicon piece may attach to the back surface of the SOI wafer 10 during process processing. For example, if the attached foreign material 17 is small one having a diameter of approximately several tens of μm, a surrounding area thereof does not float as shown in the cross-sectional structural view of FIG. 7(III); and when observed from the bonded base 11 side, the attached foreign material 17 itself nucleates and the surrounding area thereof seems to be floated. The floated area exists as an unbonded portion; and therefore, a contact area of the fitting portion 13 reduces and this causes a factor to be concerned about degradation of airtight seal performance. As described above, regardless of whether the attached foreign material 17 is hard or soft, countermeasures against the attached foreign material 17 remained on the fitting portion 13 in the process of being bonded to the base 11 are important.

Next, the scratch 16 often occurs by coming in contact with the transfer system and the like of the aforementioned equipment. In this case, the occurrence state of the scratch 16 caused by coming in contact with the transfer system will be described. For example, the scratch 16 occurs in an inspection process transferred by tweezers or the like or by a contact with a vacuum chuck of process equipment, jig and tool etc. In the scratch 16 occurred on the fitting portion 13, there exist two types of scratches, one is a scratch which is deeply bored and a silicon scrap is scattered around and the other is small one in which a scratch groove is shallow and a silicon scrap is not generated. Examples that influence airtight performance of the cavity 8a include, for example, one in which the groove depth of the scratch 16 exceeds 100 Å (angstrom) and one in which the silicon scrap is scattered around and, more particularly, the scratch 16 formed across from the cavity 8a to the cut surface of the absolute pressure sensor element 100 is an object. Such scratch 16 forms a leak path which causes slow leak; and therefore, countermeasures thereagainst are needed.

Furthermore, among the attached foreign materials 17 and the scratches 16, one occurred on the main surface of the SOI wafer 10 in which the piezoresistances 4 and the wiring 5 are present can be discriminated by a stereoscopic microscope; and therefore, quality can be easily determined. However, any chip address is not provided on the back surface side of the SOI wafer 10; and therefore, identification of a position is difficult even when the chip address is found. Furthermore, if in the subsequent process of deep dug etching, granted that the attached foreign material 17 is found, dangerousness such as damage to the diaphragm 9 hangs around and therefore it is difficult to positively remove the attached foreign material 17. In addition, degradation of contact force of the fitting portion 13 due to contamination may cause a cut during dicer cutting and a crack or a peel-off during separation, and a peeled-off portion brings about the possibility of damage to other sensor element 100.

SUMMARY OF THE INVENTION

The present invention has been made to solve the problem described above, and an object of the present invention is to provide a sensor element intended to solve the problem of degradation of airtight seal performance in a cavity and degradation of contact force of a fitting portion, such degradation being occurred via a bump of an attached foreign material or a scratch.

Means for Solving the Problems

According to the present invention, there is provided a sensor element which includes: a first substrate in which a diaphragm is configured on a main surface; a second substrate which is provided on the side opposite to the diaphragm of the first substrate; a cavity which is provided just below the diaphragm of the first substrate; a fitting portion which is provided at a bonding position between the first substrate and the second substrate for airtight sealing of the cavity; and a bump portion which is provided at the fitting portion, and protects a fitted state between the first substrate and the second substrate.

Furthermore, the bump portion is provided with a protective layer on the side opposite to the diaphragm of the first substrate, the bump portion being formed by providing a bump on the fitting portion by the protective layer.

Still furthermore, the bump portion is integrally formed with the first substrate.

Yet furthermore, the second substrate is provided with groove processing for airtight sealing of the bump portion.

Further, the protective layer is selected from a material having a function for obtaining a getter effect to maintain airtightness of the cavity by absorbing discharged gas in the cavity.

Still further, the protective layer is selected from a thin film material containing at least any of aluminum (Al), nickel (Ni), silicon (Si), silicon nitride film, silicon oxide film, and diamond-like carbon (DLC); alternatively, the protective layer is selected from a thin film material containing at least any of zirconium (Zr), titanium (Ti), hafnium (Hf), cerium (Ce), thorium (Th), and magnesium oxide (MgO), each of which being capable of obtaining a gettering effect.

Yet further, the second substrate is provided with groove processing in a method that obtains a cross-sectional structure processed along the shape of a facing die.

Advantageous Effect of the Invention

According to a sensor element of the present invention, there can be obtained a sensor element capable of solving the problem of degradation of airtight seal performance in a cavity and degradation of contact force of a fitting portion, both degradation being occurred via a bump of an attached foreign material or a scratch.

The foregoing and other objects, features, aspects and advantages of the present invention will become more apparent from the following detailed description of the present invention when taken in conjunction with the accompanying drawings.

DETAILED DESCRIPTION OF THE INVENTION

Mode for Carrying out the Invention

Embodiment 1

Figure 1A:
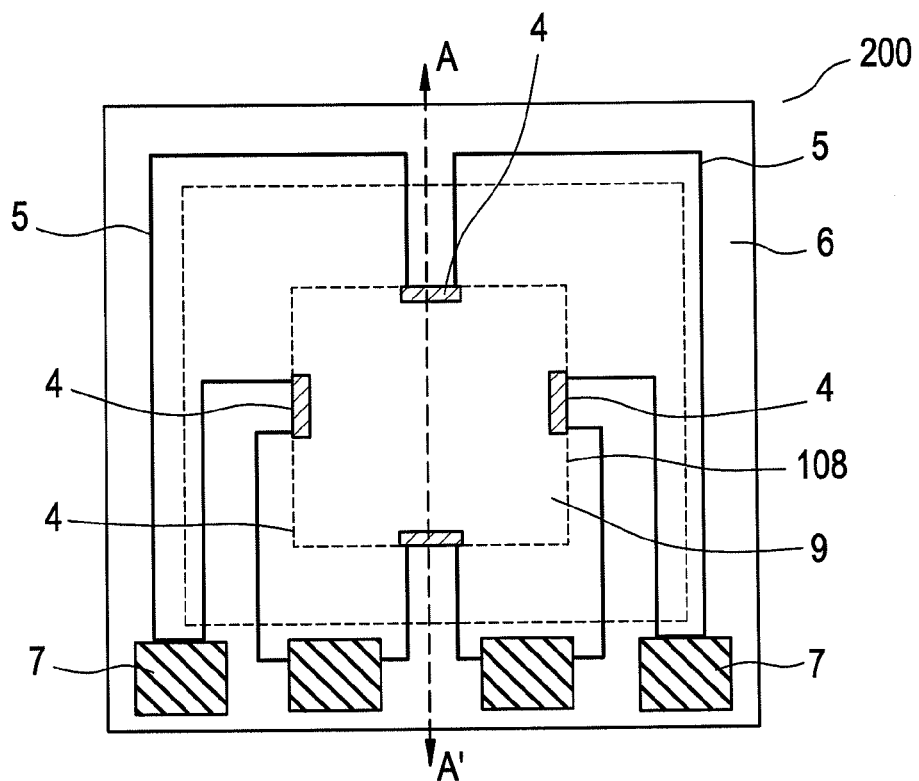
FIG. 1A is a structural plan view of a sensor element formed with a bump intended for fitting protection so that a fitting region does not come in contact with the outside by forming a protective layer on the back surface side of an SOI wafer in Embodiment 1 of the present invention.
Figure 1B:
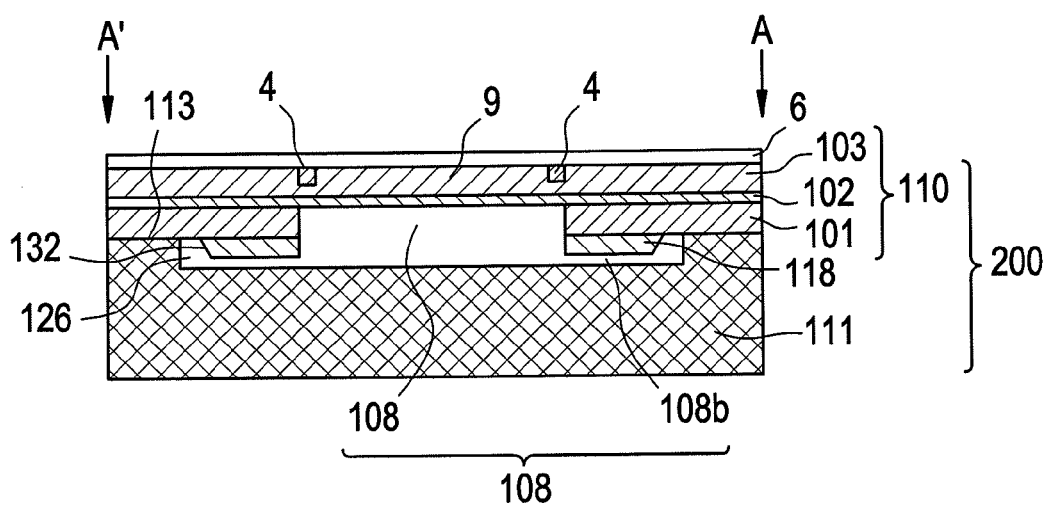
FIG. 1B is a cross-sectional structural view obtained by cutting a A-A' portion.
Figure 3:
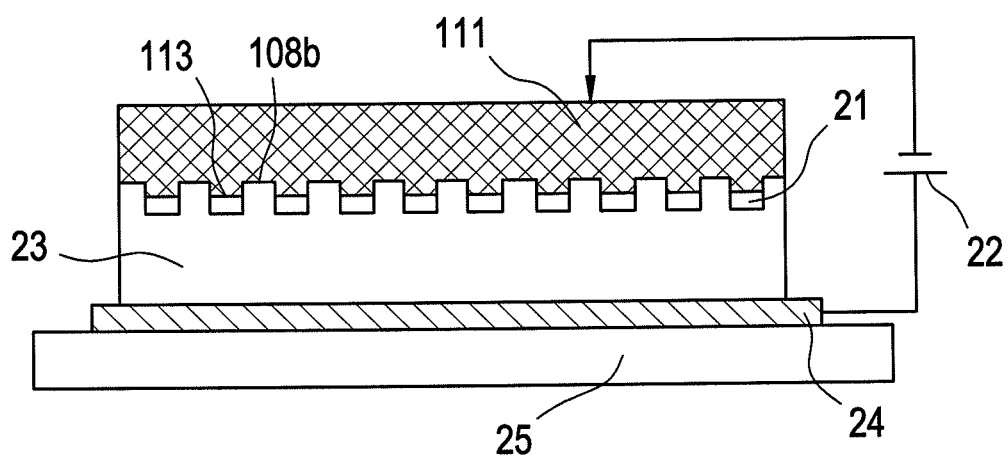
FIG. 3 is a view showing equipment that obtains a cross-sectional structure by performing groove processing to a base in Embodiment 1 of the present invention along the shape of a facing die.
Figure 4:
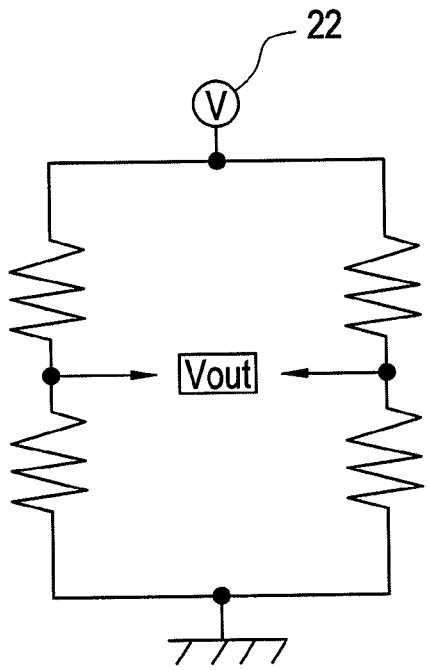
FIG. 4 is a view showing a Wheatstone bridge circuit of the sensor element obtained in Embodiment 1 of the present invention, a reading position of an output voltage value of gauge resistance to be detected by an air tight test, and a power supply voltage.
Figure 5:
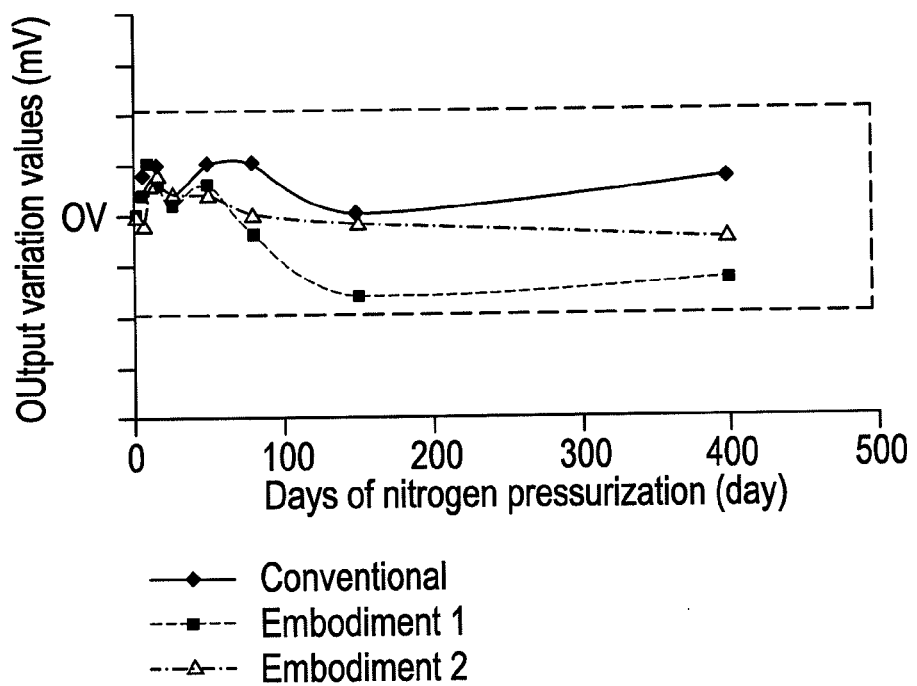
FIG. 5 is a view in which, among air tight reliability test results obtained in Embodiment 1 of the present invention, output variation values corresponding to days of nitrogen pressurization are measured and graphed.

Hereinafter, Embodiment 1 of the present invention will be described with reference to FIGS. 1 to 5; however, in each of the drawings, identical or equivalent members and portions will be described with the same reference numerals assigned thereto. FIG. 1A is a structural plan view of a sensor element formed with a bump intended for fitting protection so that a fitting region does not come in contact with the outside by forming a protective layer on the back surface side of an SOI wafer in Embodiment 1 of the present invention, and FIG. 1B is a cross-sectional structural view obtained by cutting a A-A'portion. FIGS. 2A to 2F are a process flow chart of a cross-sectional structure showing the sensor element obtained by cutting the A-A' portion of the structural plan view of the sensor element shown in FIG. 1A in Embodiment 1 of the present invention. FIG. 3 is a view showing equipment that obtains a cross-sectional structure by performing groove processing to a base in Embodiment 1 of the present invention along the shape of a facing die. FIG. 4 is a view showing a Wheatstone bridge circuit of the sensor element obtained in Embodiment 1 of the present invention, a reading position of an output voltage value of gauge resistance to be detected by an air tight test, and a power supply voltage. FIG. 5 is a view in which, among air tight reliability test results obtained in Embodiment 1 of the present invention, output variation values corresponding to days of nitrogen pressurization are measured and graphed.

With reference to Embodiment 1 of the present invention, respective drawings will be described taking a sensor element 200 that is one of sensor devices as an example.

First, FIG. 1A is a structural plan view showing the whole of the sensor element 200 being cut and separated by a method of a dicer or the like from an SOI wafer 110 serving as a first substrate. The sensor element 200 is cut out in the shape of a square or rectangle as shown in the drawing and the sensor element 200 shown in the drawing is provided in a square size of, for example, 1.2 mm×1.2 mm. Furthermore, a plurality of the sensor elements 200 are provided in block in a regularly arranged state in the SOI wafer 110.

Hereinafter, respective reference numerals shown in the structural plan view of FIG. 1A of the sensor element 200 obtained by being cut will be described. Incidentally, in the drawings, a part of dicing lines remained on—the cut surfaces of the sensor element 200 will not be shown.

First, reference numeral 200 denotes the sensor element obtained in Embodiment 1 of the present invention. The sensor element 200 uses the SOI wafer 110 manufactured by the UNIBOND method. The SOI wafer 110 includes an n-type active layer 101 which has plane orientation of (100) and is made of silicon or the like, an embedded oxide film 102 made of a silicon oxide film, and a supporting substrate 103. Incidentally, the wafer thickness is, for example, 500 μm.

Next, 7 denotes a terminal pad which is formed by a sputtered thin film containing aluminum as a main component. As for arrangements, four terminal pads are arranged in parallel respectively as shown in the drawing. 4 denotes a piezoresistance obtained by, for example, an impurity diffusion method or ion implantation. The piezoresistances 4 are provided in a total of four numbers in a diaphragm 9. 5 denotes wiring by which the piezoresistance 4 is electrically connected to the terminal pad 7. The wiring 5 is made of, for example, diffusion wiring by ion implantation or a metal material containing aluminum as a main component. The wiring 5 and the piezoresistances 4 constitute a Wheatstone circuit.

Next, 6 denotes an insulating film made of, for example, a silicon oxide or silicon nitride film; and the insulating film 6 is coated on the whole surface of the main surface of the SOI wafer 110 including the piezoresistances 4, the wiring 5, and the terminal pads 7, those of which constituting the sensor element 200. In this regard, however, the upper part of the terminal pad 7 needs to be opened; and therefore, the insulating film 6 on the opened portion is removed by a processing method such as etching. 9 denotes the diaphragm which is formed on the main surface of the SOI wafer 110 on the side where a circuit or the like is provided and has a detection function by microfabrication and film stress control. The diaphragm 9 retains its state while maintaining constant tension by stress control of the thin film including the insulating film 6 or the like. The wiring 5 and the terminal pads 7 are provided on the diaphragm 9 and in the vicinity thereof to have a function in which signals are transmitted to the outside.

Next, all the elements provided to the back surface side of the sensor element 200 are shown by dotted lines in the structural plan view shown in the drawing. First, a dotted line portion provided just below the diaphragm 9 is a cavity 108a. The cavity 108a is formed in, for example, a square opening with a 0.4 mm square shape on the back surface of the SOI wafer 110 and then formed by deep dug etching such as ICP-RIE.

Next, a dotted line shown outside the cavity 108a shows a position in which a gap 108b is provided. The gap 108b and the cavity 108a are communicated as a cavity portion 108 and are maintained at the same degree of vacuum. Furthermore, a fitting portion 113 is provided in a region from the position of the gap 108b to the cut surfaces of the sensor element 200. The SOI wafer 110 serving as the first substrate is bonded to a base 111 serving as the second substrate in the region of the fitting portion 113. The distance from the dotted line outside the cavity 108a to the cut surface is designed in, for example, 0.25 mm width. Furthermore, the fitting portion 113 is provided near the back surfaces of the terminal pads 7.

Next, the sensor element 200 formed in Embodiment 1 of the present invention will be described by using FIG. 1B. FIG. 1B is a view of a hypothetical cross-sectional structure of an absolute pressure sensor element 200 obtained by cutting the A-A' portion shown in FIG. 1A. As shown in the drawing, the sensor element 200 has a structure in which the SOI wafer 110 serving as the first substrate is bonded to the base 111 of 1 mm thick glass serving as the second substrate. In Embodiment 1 of the present invention, borosilicate glass is used for the base 111.

The sensor element 200 differs from the conventional sensor element as follows: (1) the gap 108b is provided on the glass the side serving as the base 111; (2) the volume of the cavity portion 108 of the sensor element 200 is enlarged by the gap 108b; (3) a protective layer 118 is provided on the back surface of the SOI wafer 110; and (4) a region of the protective layer 118 is provided on the back surface of the SOI wafer 110 and therefore a bonding area serving as the fitting portion 113 is narrower than the aforementioned conventional sensor element 100.

The gap 108b is formed in, for example, 0.35 mm width from the center of the sensor element 200 and the protective layer 118 is provided in the gap 108b. The protective layer 118 is a silicon oxide film, having a thickness of, for example, approximately 0.5 μm to 1 μm and the protective layer 118 is provided within a range between the dotted line where the cavity 108a is present and another dotted line shown in the structural plan view of FIG. 1(a). Furthermore, a gap 126 is provided between the fitting portion 113 and the protective layer 118 as shown in the drawing.

Furthermore, the protective layer 118 is formed for the purpose of protecting the region of the fitting portion 113. The protective layer 118 is provided and accordingly the fitting portion 13 is protected by the bump portion 132. Furthermore, groove processing to the base 111 side needs to be performed for airtight sealing of the protective layer 118 in the cavity portion 108. This mechanism is such that the gap 108b is provided by the groove processing. In Embodiment 1 of the present invention, the groove depth of the base 111 is formed in, for example, 5 μm depth.

Hereinafter, the groove processing to the base 111 will be described. The glass processing includes isotropic etching by chemical solution, sandblast processing, dry etching, laser machining, machining by a diamond drill, ultrasonic machining, and the like. Isotropic etching using hydrofluoric acid is used for general glass etching; however, in the case of using borosilicate glass, sodium (Na), boron (b), and the like are contained in the composition thereof; and therefore, such component makes an etching surface rough easily. A method for processing a glass substrate by dry processing is introduced in Japanese Unexamined Patent Publication No. 2008-088017. Incidentally, in the case of performing the groove processing to the base 111, alignment formation is also needed at the same time together with the groove formation. In Embodiment 1 of the present invention, groove processing by sandblast processing is performed.

Next, the cross-sectional structure of the sensor element 200 obtained in Embodiment 1 of the present invention will be described in numerical order using the manufacturing process flow chart of FIGS. 2A to 2F. FIGS. 2A to 2F are views of a hypothetical cross-sectional structure of the sensor element 200 obtained by cutting the A-A' portion shown in FIG. 1A. Incidentally, a method for forming a piezoresistance 4 and an insulating film 6 provided on the main surface of an SOI wafer 110 is the same as the aforementioned conventional process flow; and therefore, the description will not be repeated hereinafter.

Figure 2A:
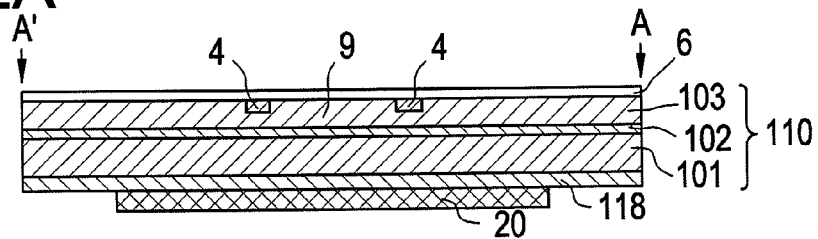
FIGS. 2A to 2F are a process flow chart of a cross-sectional structure showing the sensor element obtained by cutting the A-A' portion of the structural plan view of the sensor element shown in FIG. 1A in Embodiment 1 of the present invention.

First, FIG. 2A shows a structural cross-sectional view in which the piezoresistances 4 and the like are provided in order on the main surface of the SOI wafer 110; and then, the insulating film 6 is coated thereon and openings are formed above pads; after that, a protective layer 118 and a resist mask 20 are provided on the back surface of the SOI wafer 110 at the positions shown in the drawing. First, in order to remove a scratch 16 and an attached foreign material 17 occurred before the aforementioned process, the back surface of the SOI wafer 110 is cleaned. Cleaning may be performed by any method such as dry etching, wet etching, or polishing; however, cleanliness on the back surface side of the SOI wafer 110 is required.

Next, a silicon oxide film is formed on the back surface of the SOI wafer 110 by sputtering or CVD. Next, a region shown in the drawing is coated with the resist mask 20. The resist mask 20 is provided by photoengraving or processing procedure with a double sided aligner after resist coating. Incidentally, at this step of the photoengraving processing, patterning of an address number is performed on each protective layer 118.

Figure 2B:
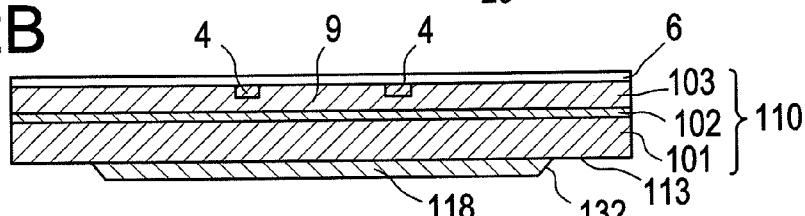

Next, in FIG. 2B, a bump portion 132 is processed with an inclination angle of, for example, 45 degrees by physical etching with ion beam or the like. This is because the attached foreign material 17 remains in a state being rubbed off at the corner of the protective layer 118, the corner being the bump portion 132; and therefore, there is the potential for influence on a fitting portion 113 depending on the size and state of the attached foreign material 17. For this reason, the protective layer 118 is provided with an inclination to separate from the region of the fitting portion 113 by the inclination angle. Furthermore, this also doubles as an improvement in coatability of the resist mask 20 provided on the protective layer 118 in which patterning is performed.

Finally, numbering is performed on each protective layer 118 by removing the resist mask 20 by incineration by plasma asking or the like. Incidentally, though a small amount, the fitting portion 113 is etched during the physical etching.

Figure 2C:
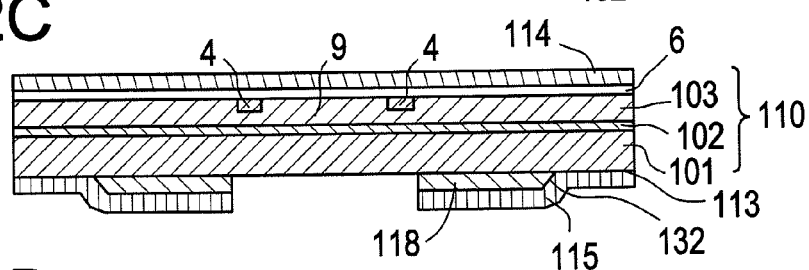

Next, in FIG. 2C, a protecting mask 114 is totally coated on the main surface of the SOI wafer 110. Next, a back side mask 115 is provided on the back surface of the SOI wafer 110 on which the protective layer 118 is provided. A positive photoresist in which coating film thickness is adjusted to, for example, 2 μm is used on each other's protecting mask 114 and back side mask 115 used in this case. Incidentally, the back side mask 115 is also similarly coated on an address number region in which patterning is performed on the protective layer 118.

Figure 2D:
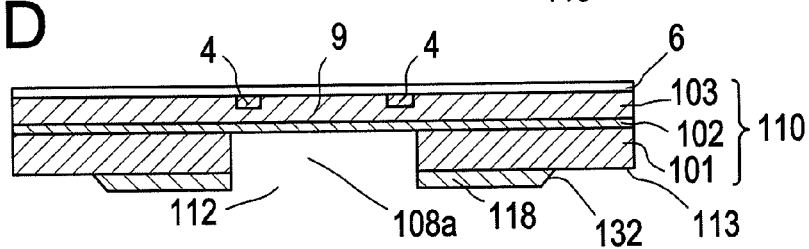

Next, in FIG. 2D, deep dug etching of ICP-RIE is performed. First, the protective layer 118 above an opening portion 112 where a cavity 108a is to be provided is removed by, for example, wet etching. The shape of the end surface of the protective layer 118 is processed more vertically than the bump portion 132 that is inclined. This is because that if the protective layer 118 on the cavity 108a side is formed with an angle of inclination with ion beam, the cross-section is tapered off to a point and therefore the film is reduced at an end region during deep dug etching; and thus, it is taken into account the influence on the shape of the cavity 108a.

Next, after the deep dug etching, the cavity 108a is formed from the back surface of the SOI wafer 110 to an embedded oxide film 102. Incidentally, the ICP-RIE is reactive etching using an inductively coupled plasma (ICP) source that generates high density plasma by dielectric coupling plasma, and the Bosch process method is adopted. In this method, sidewall protection of a processing portion of the cavity 108a by Teflon (trademark) based polymer gas and pulse etching in which bottom etching by sulphur hexa fluoride (SF6) gas is repeated by necessary times, are performed. Accordingly, the shape of the cavity 108a with a high aspect ratio can be obtained. In this deep dug etching, etching processing of an active layer 101 of the SOI wafer 110 is performed. Furthermore, the embedded oxide film 102 serves as an etching stopper. Incidentally, in the deep dug etching by the ICP-RIE, the back side mask 115 side also shrinks by the quantity corresponding to the number of times of pulse etching; however, it sometimes happens that the back side mask 115 side disappears depending on the processing condition of the etching.

The back side mask 115 and the protecting mask 114 are removed by incineration by plasma asking with, for example, etching gas containing oxygen gas as a main component. Incidentally, stripping solution may be used for removing the resist if necessary.

Figure 2E:
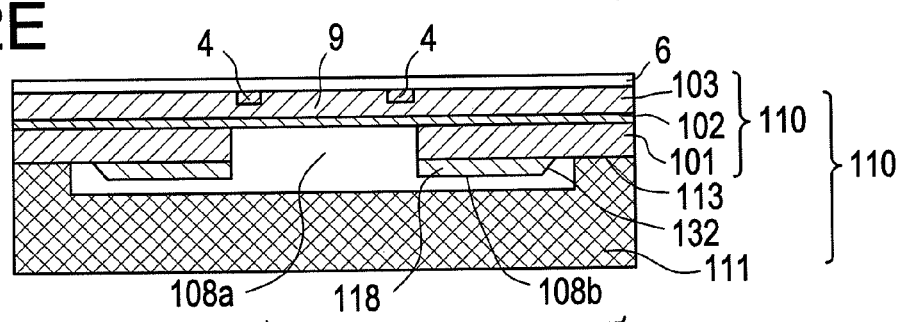

Next, in FIG. 2E, the active layer 101 of the SOI wafer 110 and the base 111 provided with the gap 108b whose section is rectangular are bonded each other by alignment adjustment; and accordingly, the structure of the drawing is obtained. Finally, the sensor element 200 of FIG. 1A can be obtained by being cut per element by dicer cutting.

Figure 2F:
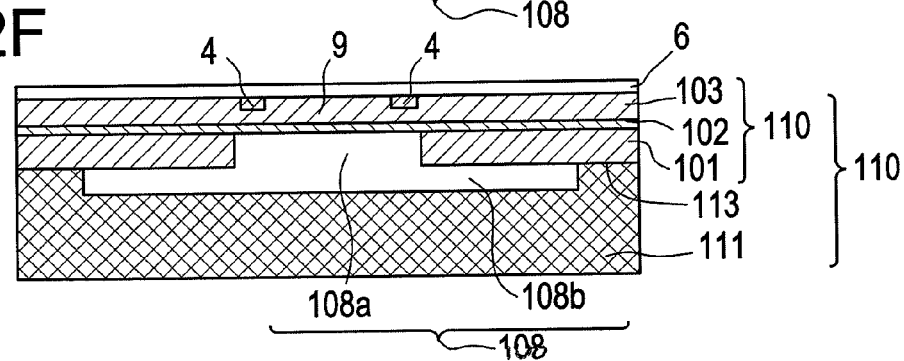

Incidentally, Embodiment 1 of the present invention has the structure in which the protective layer 118 is incorporated in the cavity portion 108; however, as shown in FIG. 2F, bonding may be performed after removing the protective layer 118. For example, after forming the cavity 108a of FIG. 2D, the protective layer 118 is removed by using, for example, buffered hydrofluoric acid solution and then the same process processing is performed in the subsequent processes of FIG. 2E; and accordingly, a structure in which the protective layer 118 is absent can be obtained. In this regard, however, the embedded oxide film 102 in the cavity 108a is also the same silicon oxide film; and therefore, the embedded oxide film 102 suffers damage by etchant used for removing.

FIG. 2F shows a structure in which the protective layer 118 is absent; however, for example, in the case where the attached foreign material 17 having a large contact area remains on the protective layer 118, the attached foreign material 17 itself serves as a mask. Therefore, when the protective layer 118 is removed only by wet etching, dry etching, or the like, the aforementioned attached foreign material 17 and a part of the protective layer 118 just below thereof remains on the back surface of the SOI wafer 110.

Further, the protective layer 118 is provided by patterning by physical etching; and accordingly, a small amount of overetching is done to the surface of the fitting portion 113 and therefore groove processing corresponding to the depth at which at least a small amount of etching is done is needed on the base 111 side. Incidentally, the numbering can be directly left to the active layer 101 on the back surface of the SOI wafer 110 by the aforementioned overetching.

Furthermore, in the case where a protective layer 118 is temporarily provided by wet etching and the protective layer 118 is tried to be removed by wet etching in order to obtain the cross-sectional structure of FIG. 2F, if the attached foreign material 17 and the protective layer 118 just below thereof can be removed from the back surface of the SOI wafer 110, the back surface of the SOI wafer 110 other than the cavity 108a can be a flat surface on which the scratch 16 and the attached foreign material 17 are not present.

If a non-processed base 111 is bonded to this SOI wafer 110, the same structure as the aforementioned conventional sensor element 100 can be obtained. In this regard, however, the numbering of the back surface of the SOI wafer 110 cannot be provided because patterning of the protective layer 118 is performed by a wet process.

Next, a bonding method to be performed in FIG. 2E will be described hereinafter. In order to airtight seal the cavity 108a just below the diaphragm 9 as in the sensor element 200, a direct bonding apparatus in which two sheets of wafers are directly bonded or an interlayer bonding apparatus that uses an intermediate material is used. For example, anodic bonding in which glass and silicon are bonded together is generally known as direct bonding; and, as other example, silicon direct bonding, plasma activated low temperature bonding, ordinary temperature surface activated bonding, and the like are known. In the case of the interlayer bonding, eutectic joint using metal, solder joint, organic adhesion, and the like correspond thereto. The anodic bonding is often used for bonding silicon to glass.

The anodic bonding method is such that, a DC voltage of about minus 500 v is applied to the base 111 side in a state where the n-type active layer 101 of the SOI wafer 110, the n-type active layer 101 being made of silicon or the like, is made to attach firmly to the base 111 made of a glass wafer to heat up to a temperature approximately 400° C. at which an alkali ion is easy to move; and accordingly, each other's substrates are jointed and bonded. Such processing is performed; and accordingly, a sodium ion or the like contained in the base 111 moves to the negative pole side and electrostatic attraction is generated at the interface between the base 111 and the SOI wafer 110. This generates a chemical reaction between silicon and an oxygen ion and large bonding force can be obtained.

The advantages of this anodic bonding method include that (1) robust bonding force can be obtained and (2) the intermediate material such as a polymer is not used and therefore the influence of de-gas or the like is small. On the contrary, the disadvantage thereof includes that deformation is generated by thermal stress after anodic bonding.

In Embodiment 1 of the present invention, processing has been performed using the airtight seal by the anodic bonding. First, a base 111 of a 1 mm thick borosilicate glass wafer having the same diameter size as an SOI wafer 110 is prepared. Incidentally, the base 111 uses a wafer provided with groove processing having the same space and the same number as a sensor element 200 provided in the SOI wafer 110. In Embodiment 1 of the present invention, the depth of the groove is, for example, 5 μm.

Next, a chamber is opened and arrangement is conducted in a state where the SOI wafer 110 and the base 11 serving as substrates are overlapped. Next, each probe needle of cathode and anode is made to contact to close the chamber; and then, processing is executed in the order of vacuuming, heating, applying of bonding voltage, and cooling.

In Embodiment 1 of the present invention, the processing is executed at an attained degree of vacuum by vacuuming $\times 10^{-4}$ Torr, a set temperature of 400° C., and a total processing time from setting to cooling of 90 min; and accordingly, the sensor element 200 is obtained.

The SOI wafer 110 is used in Embodiment 1 of the present invention; however, one formed of n-type single crystalline silicon whose plane orientation polished on both surfaces is (100) is permissible. As a material other than the single crystalline silicon, one formed of polycrystalline silicon, sapphire, or the like is also permissible.

Furthermore, silicon oxide film is used for the protective layer 118 but not limited thereto. As other material, aluminum (Al), nickel (Ni), or silicon (Si) may be used; and as an insulating material, a hard material such as silicon nitride film, silicon oxide film, or diamond-like carbon (DLC) may be used. These can be formed by sputtering or CVD.

Furthermore, a material that can obtain a gettering effect may be selected for the protective layer 118. Examples of materials for use as a getter material include, for example, zirconium (Zr), titanium (Ti), hafnium (Hf), cerium (Ce), thorium (Th), and magnesium oxide (MgO); and it is preferable to select a thin film material containing at least any of the materials described above.

Further, in Embodiment 1 of the present invention, the bump portion 132 of the protective layer 118 is processed with an inclination angle of 45 degrees by using ion beam; however, if there is not a problem in coatability of the back side mask 115, patterning of the protective layer 118 may be provided with an inclination angle of 0 degrees by physical etching. For example, in FIG. 2B, a resist mask 20 is provided on the protective layer 118 and the opening portion 112 and the fitting portion 113 may be processed at the same time. In this case, the protective layer 118 is processed in a substantially vertical shape at both ends.

Besides, the protective layer 118 can be utilized as a hard mask for processing the cavity 108a together with the back side mask 115. Furthermore, the protective layer 118 is provided between the end of the cavity 108a and the fitting portion 113; however, the protective layer 118 may be formed in any width within the range therebetween. Further, groove processing of the base 111 is performed by sandblast in Embodiment 1 of the present invention; however, glass processing by wet etching or dry etching may be used.

In addition, as other example, FIG. 3 shows an example of a glass forming method using electrostatic force. A method in which groove processing is performed on a base 111 along the shape of a die 23 using external pressure or electrostatic attraction may be used. Such a method is obtained by thermal nanoimprint process technology of glass. A mask formation process such as a resist application process can be skipped by using this method.

First, as shown in FIG. 3, a glass wafer on which the base 111 is provided is placed on the die 23 and is heated by a heater 25. Incidentally, concave portions 21 for forming a plurality of grooves on the glass wafer in block are provided on the die 23. Next, when a voltage is applied between the base 111 and an electrode 24, a minus negative charge gathers on the surface of the base 111 coming in contact with the die 23 and a plus positive charge is retained in a state of pulling each other on the die 23 side opposite to the base 111. Electrostatic attraction works on a forming portion of the glass surface at the concave portions 21 of the die 23 and die formation corresponding to the structure of the die 23 is performed so as to be drawn into the concave portions 21. This forms a plurality of the bases 111 in block on the glass wafer along the die 23.

Furthermore, the thickness of the base 111 is 1 mm in Embodiment 1 of the present invention but not limited thereto. Next, in Embodiment 1 of the present invention, the width of the fitting portion 113 is 0.25 mm; however, at least not less than 0.1 mm in width needs to be secured. In the case of not more than 0.1 mm in width, the probability in which a leak of the cavity portion 108 noticeably expands increases. Furthermore, if the size of the sensor element 200 does not have a problem functionally, any shape and size are permissible.

Embodiment 1 of the present invention uses one in which the protective layer 118 is formed by a silicon oxide film having a thickness of approximately 0.5 μm to 1 μm and groove processing of a depth of 5 μm is performed on the base 111; however, the thickness of the protective layer 118 is not limited thereto. It is preferable that the thicker the protective layer, the smaller the influence on the fitting portion 113; however, the protective layer 118 needs to be provided in a film thickness that is thinner than the groove depth of the base 111. Furthermore, in the case where a thin film material that can obtain a gettering effect is used for the protective layer 118, it is preferable that the protective layer 118 is formed by the thickness that can expect the effect and a thickness of approximately several μm is needed. Further, as for the groove depth of the base 111, the groove depth that does not interfere with the protective layer 118 needs to be provided. Any groove depth is permissible if the groove depth satisfies such requirements.

Furthermore, Embodiment 1 of the present invention uses bonding by the anodic bonding; however, for example, if it is possible to provide the structure in which the protective layer 118 or the like is not remained in the cavity portion 108 as shown in FIG. 2F, an airtight seal by direct bonding in which the base 111 made of silicon may be used. In this regard, however, a bonding temperature of approximately 1000° C. is needed; and therefore, patterning of the terminal pads 7, the piezoresistances 4, and the wiring 5 to be provided on the main surface of the SOI wafer 110 is processed after the airtight seal is performed.

Next, the sensor element 200 of FIG. 2D in which the protective layer 118 is provided in Embodiment 1 is transferred under vacuum to a coater/developer. As a result, the scratch 16 is remained on the protective layer 118; however, such influence does not appear on the fitting portion 113. As for the attached foreign material 17, there is the case where a trace being rubbed off at the corner of the end of the protective layer 118 is remained; however, attachment suppression effect to the fitting portion 113 can be obtained. Furthermore, the attached foreign material 17 that can be a bump of a foreign material is not also appeared on the fitting portion 113; and accordingly, a defect in which the base 111 floats does not occur. Further, numbering positions can be specified by microscope inspection or the like; and therefore, the attached foreign material 17 remained on the protective layer 118 can be removed as a defective piece after being separated per element by dicer cutting after the anodic bonding is performed.

FIG. 4 shows the Wheatstone bridge circuit and the positions of input and output voltages in the case of performing an air tight reliability test using the sensor element 200 of Embodiment 1 of the present invention. The air tight reliability test is a test in which the sensor element 200 is placed in a nitrogen pressurization tank and nitrogen pressurization is constantly applied to the diaphragm at, for example, not lower than 5 $kgf/cm^2$ to see changes in output voltage.

First, a power supply voltage of 5 V is applied by a power supply 22 shown in FIG. 4. Next, two output voltages are measured from the position of Vout and a difference between both voltages is found. Incidentally, a pressurization reliability test is performed till maximum 400 days, for example; and measurement corresponding to days of pressurization is performed in a state where the sensor element 200 is taken out once from the nitrogen pressurization tank. Output voltage measurement is performed under temperature conditions at a constant pressure not pressurized at all to the diaphragm 9 under standard atmospheric pressure circumstance and output voltage variation values of normal temperature characteristics of the sensor element 200 are measured.

Incidentally, if there exists a bump of a foreign material or the like due to a slow leak or a leak path on a fitting portion 113 to be airtight sealed, output voltages of piezoresistances 4 also change. Further, the output voltage is largely shifted from the early stage of pressurization depending on a state of a bonding defect of the fitting portion 113.

FIG. 5 is the view in which measured results of the output variation values corresponding to the days of nitrogen pressurization are graphed. This graph shows three curves in total, in which the aforementioned conventional sensor element 100, the sensor element 200 obtained in Embodiment 1, and a sensor element 200 to be obtained in Embodiment 2 (to be described later) of the present invention are outputted. Incidentally, a lateral axis of the graph shows the days of nitrogen pressurization and a longitudinal axis shows the output variation values.

In the output variation values of FIG. 5, an initial value is set to 0 V and a region within a dotted line represents a region within the error range of variation. Actual performance of the upper limit value and the lower limit value of the output variation obtained at the time when a plurality of the aforementioned conventional sensor elements 100 are measured is shown within the frame of the dotted line; and if the limit values are within the range, it represents that the test results equivalent to the aforementioned conventional sensor elements 100 are obtained. As is apparent from the graph results, it is recognized that the test results are stayed within the dotted line even in the case of the sensor element 200 provided by either conditions. From the aforementioned results, it is proven that the sensor element 200 obtained in the embodiment of the present invention can obtain the output variation values equivalent to the conventional output variation values.

As described above, the cavity 108a is provided just below the diaphragm 9, the cavity 108a is airtight sealed by bonding the SOI wafer 110 to the base 111, and the bump portion 132 is provided so that the region of the fitting portion 113 to be airtight sealed does not come in contact with the outside; and accordingly, cleanliness of the fitting portion 113 is maintained. Thus, the retention function of airtight performance of the sensor element 200 increases and long-term reliability can be improved.

Furthermore, the protective layer 118 is provided on the back surface of the SOI wafer 110 and the protective layer 118 serves as the bump portion 132; and accordingly, the scratch 16 and the attached foreign material 17 generated in the processing process on the back surface side of the SOI wafer 110 can be prevented from being occurred on the fitting portion 113.

Further, damage such as a defect of the fitting portion 113 is exerted to an adjacent sensor element 200 by being floated due to the bump of the attached foreign material 17. However, the attached foreign material 17 is incorporated and sealed in the sensor element 200 together with the protective layer 118; accordingly, the influence on other sensor elements 200 can be eliminated and thus a yield can be improved.

Besides, numbering or the like is performed on the protective layer 118; accordingly, the position of a defect cause can be specified and thus an inspection function can be improved.

In addition, the groove processing of the base 111 has a cavity extension function for coating the whole of the protective layer 118 on which the scratch 16 and the attached foreign material 17 are remained; accordingly, the attached foreign material 17 can be sealed in the cavity portion 108 of the target sensor element 200 and thus the influence of floating on the fitting portion 113 can be eliminated and a yield of the sensor elements 200 can be improved.

Furthermore, a getter effect function is added to the protective layer 118; accordingly, discharged gas in the cavity 108a is absorbed and an effect that maintains airtightness of the cavity 108a can be obtained.

Further, processing of the base 111 along the shape of the die 23 is performed; and accordingly, a necessary shape can be obtained more easily than the aforementioned conventional shape.

Embodiment 2

Embodiment 2 of the present invention will be described with reference to FIGS. 6A to 6F. FIGS. 6A to 6F are a process flow chart of a cross-sectional structure showing a sensor element obtained by cutting a A-A' portion of the structural plan view of a sensor element shown in FIG. 1A, the sensor element being formed with a fitting portion bump on the back surface side by processing an SOI wafer in Embodiment 2 of the present invention. Hereinafter, description will be made in numerical order of the drawing.

Figure 6A:
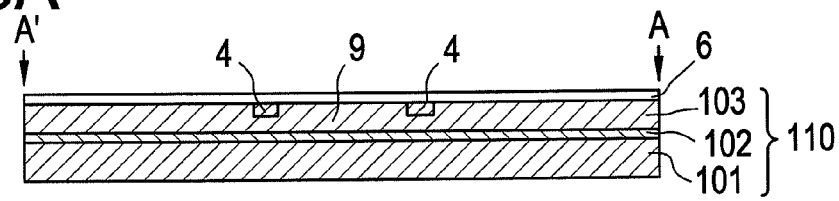
FIGS. 6A to 6F are a process flow chart of a cross-sectional structure showing the sensor element obtained by cutting a A-A' portion of a structural plan view of the sensor element shown in FIG. 1(a) in Embodiment 2 of the present invention, the sensor element being formed with a fitting portion bump on the back surface side by processing an SOI wafer.

First, FIG. 6A is a structural cross-sectional view of an SOI wafer 110 in which piezoresistances 4, an insulating film 6, and the like are provided. Next, in FIG. 6B, a resist mask 20, for example, having a thickness of 1 μm of a resist material is provided on the back surface of the SOI wafer 110. Next, a bump portion 132 of a fitting portion 113 in the drawing is formed in an active layer 101 by performing dry etching of reactive ion etching (RIE) by mixed gas of, for example, fluorine based gas and oxygen ($O_2$). The bump portion 132 of the fitting portion 113 is provided in 1 μm thickness. Next, the resist mask 20 remained on the back surface of the SOI wafer 110 is removed by incineration by a plasma asher.

Figure 6B:
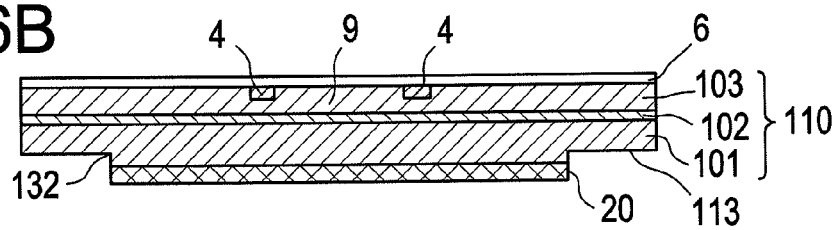
Figure 6C:
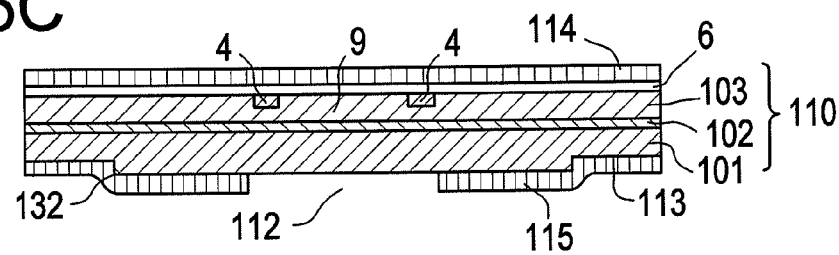

Next, in FIG. 6C, a resist material serving as a protecting mask 114 is totally coated on the main surface of the SOI wafer 110; and then, patterning is performed by a back side mask 115 from the bump portion 132 of the fitting portion 113 on the back surface of the SOI wafer 110 to an opening portion 112 of a cavity 108a. Incidentally, the resist materials used on both surfaces are the same photoresist having the same thickness of 2 μm.

Figure 6D:
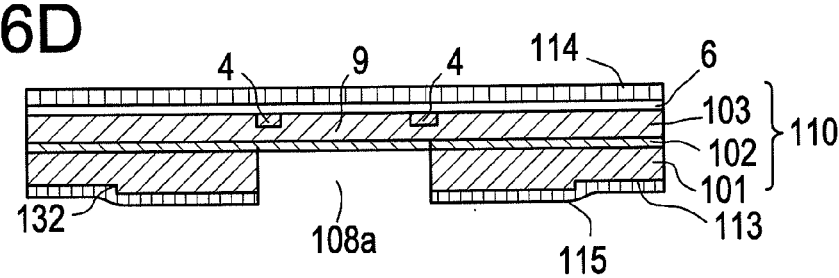
Figure 6E:
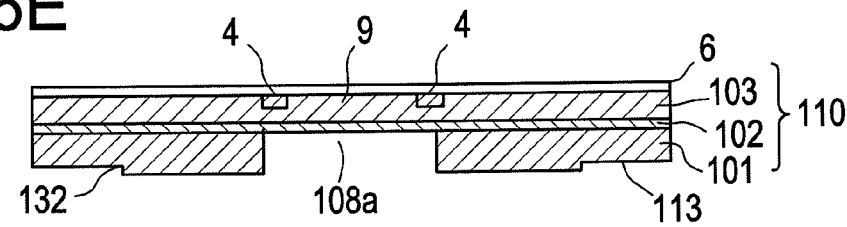
Figure 6F:
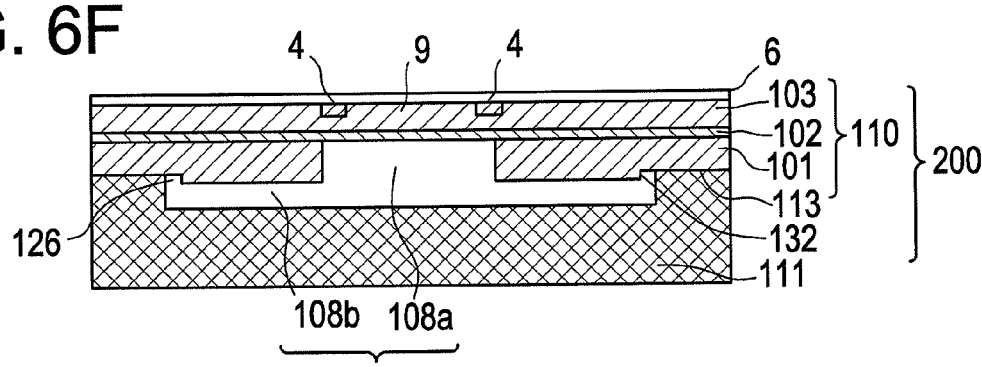
Figure 7A:
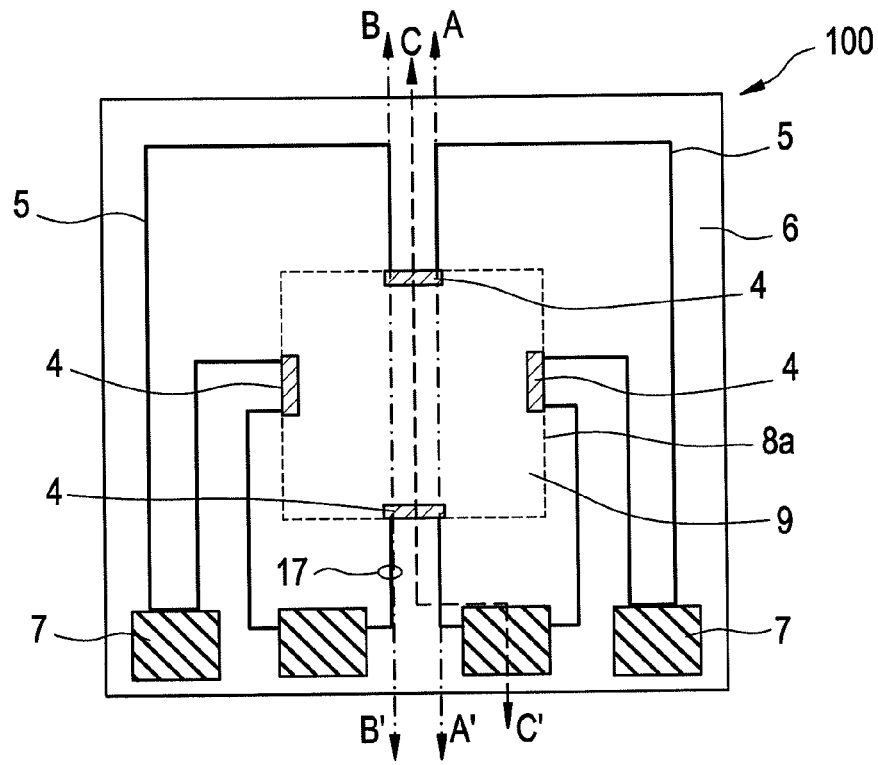
FIG. 7A is a structural plan view of a conventional sensor element.
Figure 7B:
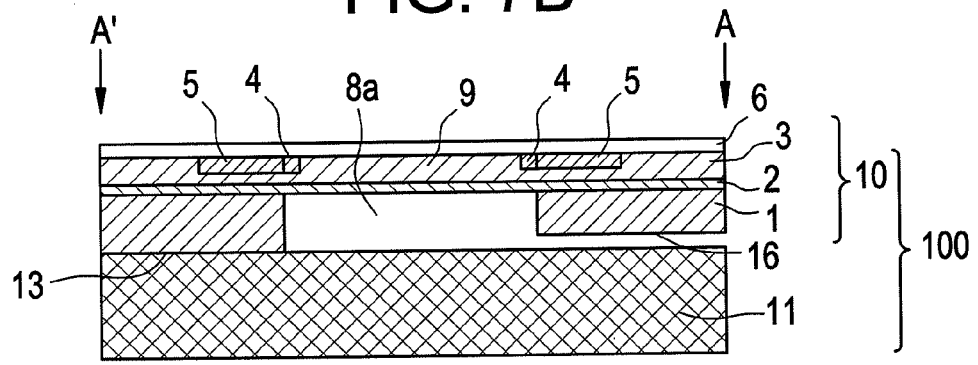
FIGS. 7B and 7C are cross-sectional structural views of the sensor element obtained by cutting a A-A' portion and a B-B' portion, those of which being the ones that image defect cases occurred by a scratch and a bump of an attached foreign material.
Figure 7C:
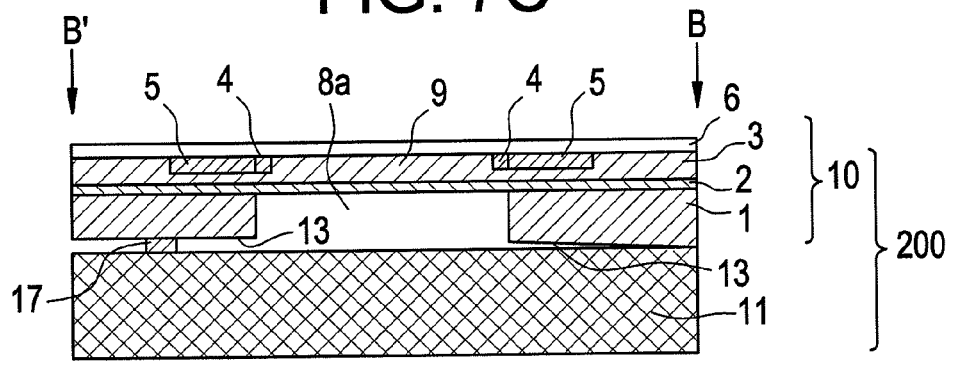
Figure 8A:
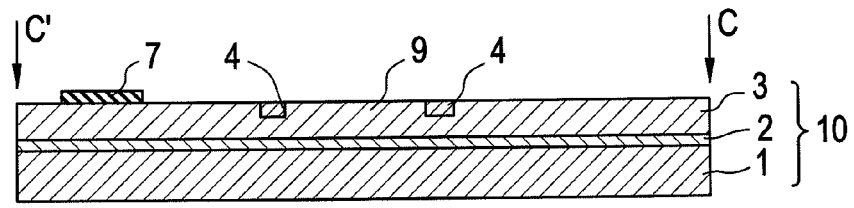
FIGS. 8A to 8F are a process flow chart of a cross-sectional structure of the sensor element obtained by cutting a C-C' portion of FIG. 7A that is the structural plan view of the conventional sensor element.
Figure 8B:
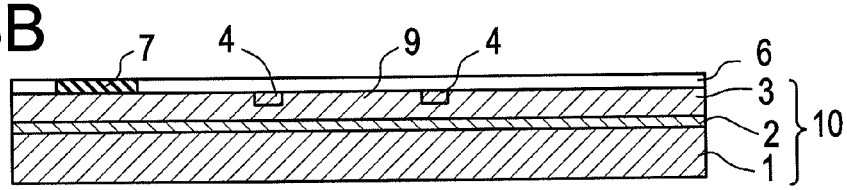
Figure 8C:
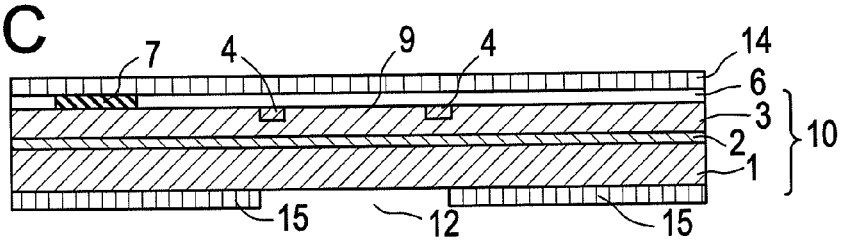
Figure 8D:
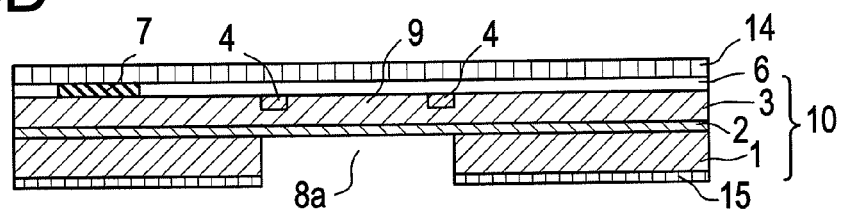
Figure 8E:
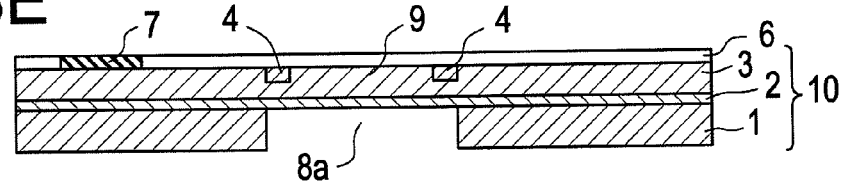
Figure 8F:
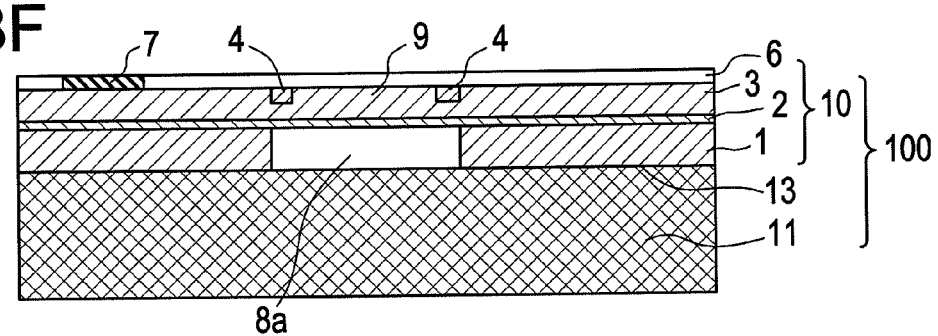
Figure 9A:
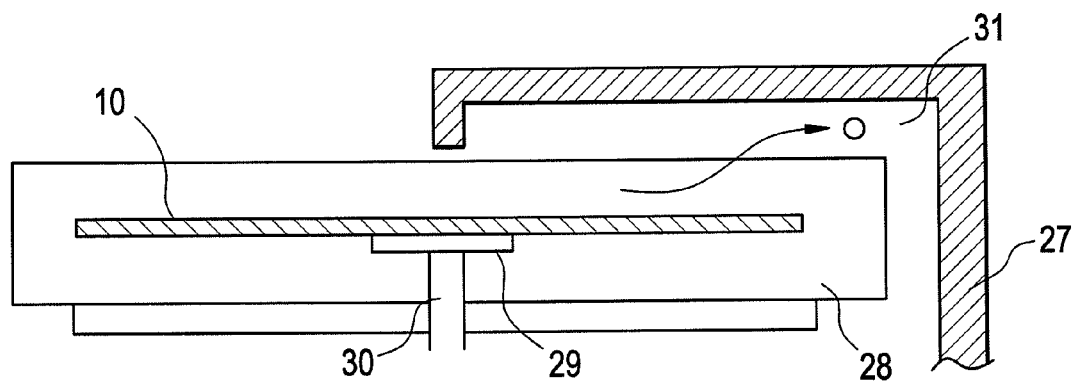
FIGS. 9A and B are views that image cases where a scratch is formed on and attached foreign materials are transcribed to the back surface of an SOI wafer in the resist coating process of the conventional sensor element.
Figure 9B:
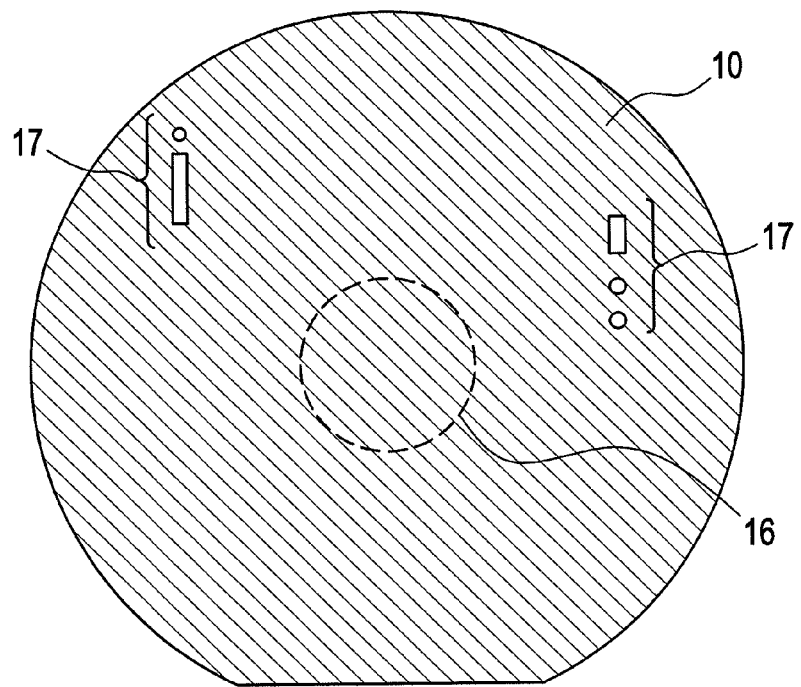

Deep dug etching by ICP-RIE is performed in FIG. 6D; in FIG. 6E, the protecting mask 114 and the back side mask 115 are removed by plasma ashing; and accordingly, processes to the SOI wafer 110 side are completed. Finally, anodic bonding to a base 111 in which groove processing is performed so as to be 5 μm depth is performed; and accordingly, necessary structure of a sensor element 200 can be obtained (FIG. 6F).

Embodiment 2 of the present invention is characterized in that, in place of forming a protective layer 118, the active layer 101 of the SOI wafer 110 is processed to provide the bump portion 132 of the fitting portion 113.

In Embodiment 2 of the present invention, the fitting portion 113 and the bump portion 132 of FIG. 6B are provided by the RIE dry etching with the mixed gas; however, an inclination may be provided and processed by physical etching with ion beam.

Furthermore, in order to remove a scratch 16 and an attached foreign material 17 occurred on the main surface of the SOI wafer 110 in the patterning process before the process processing of FIG. 6A, it is preferable to perform cleaning of the back surface of the SOI wafer 110. In this regard, however, if cleanliness of a fitting region can be obtained by processing of the fitting portion 113 and the bump portion 132 of FIG. 6B, the aforementioned cleaning is not needed.

Further, the back side mask 115 is formed by only the resist; however, for example, the getter material and the resist mask may be provided in order in a laminated manner on the back surface side of the SOI wafer 110 in the process of FIG. 6B.

Besides, the fitting portion 113 is provided near just below terminal pads 7; and therefore, the depth of the bump portion 132 of the fitting portion 113 is not limited to 1 μm depth, but the same effect can be obtained even in the case of 0.5 μm depth. Then, as for the deeper depth, it is preferable to be processed to the extent that it does not influence the bonding by wire bond or the like.

In addition, the depth of the bump portion 132 of the fitting portion 113 does not correspond with the depth of the groove formed in the base 111 and the depth on the base 111 side needs to be formed deeper.

Furthermore, the SOI wafer 110 is used in Embodiment 2 of the present invention; however, one formed of n-type single crystalline silicon whose plane orientation polished on both surfaces is (100) is permissible. As a material other than the single crystalline silicon, one formed of polycrystalline silicon, sapphire, or the like is also permissible.

Further, in Embodiment 2 of the present invention, the anodic bonding is performed between the SOI wafer 110 and the base 111 and the cross-sectional structure shown in FIG. 6F is obtained; however, direct bonding is performed between silicon and silicon by using the groove processed base 111 to obtain a cavity portion 108 and then piezoresistances 4, wiring 5, and terminal pads 7 may be provided.

As described above, in place of the protective layer 118, the bump processing is directly performed on the back surface of the SOI wafer 110 so that the fitting 113 region does not come in contact with the outside; and accordingly, the same effect as the case where the protective layer 118 is provided can be obtained.

Next, the sensor element 200 obtained in Embodiment 2 of the present invention is transferred under vacuum to a coater/developer; and as a result, the same effect as Embodiment 1 of the present invention can be obtained on the back surface side of the SOI wafer 110.

While the presently preferred embodiments of the present invention have been shown and described. It is to be understood that these disclosures are for the purpose of illustration and that various changes and modifications may be made without departing from the scope of the invention as set forth in the appended claims.

What is claimed is:

1. A sensor element comprising:
   a first substrate in which a diaphragm is configured on a main surface;
   a second substrate which is provided on the side opposite to the diaphragm of said first substrate;
   a cavity which is provided just below the diaphragm of said first substrate;
   a fitting portion which is provided at a bonding position between said first substrate and said second substrate for airtight sealing of the cavity; and
   a bump portion which is provided at the fitting portion, and protects a fitted state between said first substrate and said second substrate, the bump portion extending from the first substrate and not contacting the second substrate.

2. The sensor element of claim 1,
   wherein the bump portion is provided with a protective layer on the side opposite to the diaphragm of said first substrate, the bump portion being formed by providing a bump on the fitting portion.

3. The sensor element of claim 2,
   wherein said protective layer is selected from a material having a function for obtaining a getter effect to maintain airtightness of the cavity by absorbing discharged gas in the cavity.

4. The sensor element of claim 2,
   wherein said protective layer is selected from a thin film material containing at least any of aluminum (Al), nickel (Ni), silicon (Si), silicon nitride film, silicon oxide film, and diamond-like carbon (DLC); alternatively, said protective layer is selected from a thin film material containing at least any of zirconium (Zr), titanium (Ti), hafnium (Hf), cerium (Ce), thorium (Th), and magnesium oxide (MgO), each of which being capable of obtaining a gettering effect.

5. The sensor element of claim 1,
   wherein the bump portion is integrally formed with said first substrate.

6. The sensor element of claim 1,
   wherein said second substrate is provided with groove processing for airtight sealing of the bump portion.

7. The sensor element of claim 1,
   wherein the bump portion is formed by providing a bump on the surface opposite to the diaphragm of said first substrate.

8. The sensor element of claim 1,
   wherein said second substrate is provided with groove processing in a method that obtains a cross-sectional structure processed along the shape of a facing die.

9. The sensor element of claim 1,
   wherein said first substrate is configured by an active layer, an embedded oxide film, and a supporting substrate.

10. The sensor element of claim 1,
    wherein said second substrate is configured by a base made of a material having the same quality as said first substrate or a glass wafer.

11. The sensor element of claim 1,
    wherein said sensor element is applied to a pressure sensor.

12. The sensor element of claim 1, wherein the bump portion comprises a surface that is inclined with respect to the fitting portion.

* * * * *